United States Patent [19]

Leedecke et al.

[11] Patent Number: 4,725,333

[45] Date of Patent: Feb. 16, 1988

[54] METAL-GLASS LAMINATE AND PROCESS FOR PRODUCING SAME

[75] Inventors: Charles J. Leedecke, Northford; Norman G. Masse, Wallingford; Michael J. Pryor, Woodbridge, all of Conn.

[73] Assignee: Olin Corporation, New Haven, Conn.

[21] Appl. No.: 811,846

[22] Filed: Dec. 20, 1985

[51] Int. Cl.[4] .......................... C03B 29/00; B32B 17/06; C03C 15/00

[52] U.S. Cl. .......................................... 156/630; 65/32; 65/59.23; 65/59.4; 65/60.4; 65/157; 156/632; 156/667; 501/26; 501/72; 428/433; 428/632

[58] Field of Search ............... 156/630, 632, 666, 667; 65/59.23, 59.3, 59.34, 59.4, 60.4, 32, 149, 154, 148, 157, 185; 501/26, 72; 428/433, 632

[56] References Cited

U.S. PATENT DOCUMENTS

| | | | |
|---|---|---|---|
| 1,809,863 | 6/1931 | Paxton | 65/157 X |
| 2,233,622 | 3/1941 | Lytle | 65/32 |
| 2,873,556 | 2/1959 | Hainke | 65/32 |
| 3,200,298 | 8/1965 | Garibotti | 317/101 |
| 3,723,176 | 3/1973 | Theobald et al. | 264/61 X |
| 3,968,193 | 7/1976 | Langston et al. | 65/60.4 X |
| 4,024,309 | 5/1977 | Pender | 65/32 X |
| 4,215,020 | 7/1980 | Wahlers et al. | 501/17 X |
| 4,299,873 | 11/1981 | Ogihara et al. | 428/137 |
| 4,301,324 | 11/1981 | Kumar et al. | 174/68.5 |
| 4,313,026 | 1/1982 | Yamada et al. | 174/68.5 |
| 4,385,202 | 5/1983 | Spinelli et al. | 174/68.5 |
| 4,491,622 | 1/1985 | Butt | 428/632 |

FOREIGN PATENT DOCUMENTS

| | | | |
|---|---|---|---|
| 1404569 | 5/1964 | France | 65/32 |
| 1232621 | 5/1971 | United Kingdom . | |
| 1349671 | 5/1974 | United Kingdom . | |

OTHER PUBLICATIONS

"The Direct Bonding of Metals to Ceramics by the Gas-Metal Eutectic Method" by Burgess et al., *J. Electrochemical Society: Solid-State Science and Technology.*
"Packaging" by Jerry Lyman, *Electronics,* vol. 54, No. 26, Dec. 1981.
"Glass-Science and Technology" edited by D. R. Uhlmann, Academic Press, Inc. 1984, pp. 45-106.

*Primary Examiner*—Robert L. Lindsay
*Attorney, Agent, or Firm*—Howard M. Cohn; Paul Weinstein

[57] ABSTRACT

This application is directed to a process of forming a laminate. The steps include providing a glass and a metal foil of either deoxidized copper alloy or oxygen-free copper alloy. The glass is heated at a temperature of between about 600° to about 1025° C. with a viscosity between about $10^3$ to about $10^8$ poise. Then it is pressed against the foil and cooled to chemically bond it to the foil and form a laminate of a metal foil and a substantially pore-free glass.

18 Claims, 5 Drawing Figures

METAL-GLASS LAMINATE AND PROCESS FOR PRODUCING SAME

This application is related to U.S. patent application Ser. No. 413,046 entitled "Multi-Layer Circuitry" by Sheldon H. Butt, filed Aug. 30, 1982; U.S. patent application Ser. No. 651,984 entitled "Sealing Glass Composite" by Edward F. Smith, III, filed Sept. 19, 1984 now abandoned; U.S. patent application Ser. No. 651,987 entitled "Sealing Glass Composite" by Edward F. Smith, III et al., filed Sept. 19, 1984 (now abandoned); U.S. patent application Ser. No. 707,636, entitled "Pin Grid Arrays" by Michael J. Pryor, filed Mar. 4, 1985 (now abandoned); U.S. patent application Ser. No. 811,908(now abandoned), entitled "Steel Substrate with Bonded Foil" by Richard A. Eppler, filed Dec. 20, 1985; U.S. patent application Ser. No. 811,905, entitled "Hybrid and Multi-Layer Circuitry" by Michael J. Pryor et al., filed Dec. 20, 1985; U.S. patent application Ser. No. 811,911, entitled "A Hermetically Sealed Package" by Michael J. Pryor et al., filed Dec. 20, 1985; U.S. patent application Ser. No. 811,910, entitled "A Method of Joining Metallic Components" by Michael J. Pryor et al., filed Dec. 20, 1985; U.S. patent application Ser. No. 811,907, entitled "Hybrid and Multi-Layer Circuitry" by Michael J. Pryor et al., filed Dec. 20, 1985; U.S. patent application Ser. No. 811,906, entitled "Multi-Layer and Pin Grid Arrays" by Michael J. Pryor, filed Dec. 20, 1985; and U.S. Pat. No. 4,491,622 entitled "Composites of Glass-Ceramic to Metal Seals and Method of Making the Same" by Sheldon H. Butt, issued Jan. 1, 1985.

While the invention is subject to a wide range of applications, it is particularly useful for hybrid circuitry and multi-layer applications and will be particularly described in that connection. More specifically, the invention is directed to laminating an oxygen-free or deoxidized copper foil to a bonding glass.

As the density of integrated circuit (IC) devices, also known as chips, has continued to increase, the chips are often mounted on hybrid circuitry. Despite continued advances in IC design and capability, the hybrid circuitry technology has remained substantially static.

Examples of hybrid circuitry design are described in a number of patents including U.S. Pat. Nos. 3,200,298, 3,723,176, 4,299,873 and 4,313,026. The hybrid substrate is typically a thin and relatively small piece of ceramic material, such as $Al_2O_3$, mixed with an organic binder and formed into a green sheet or substrate. Size is typically limited to a square of about four square inches. Conductive circuitry on the hybrid substrate may be formed by first silk screening a paste of gold, glass and a binder in any desired pattern onto a surface of the green ceramic substrate. The resulting assembly is fired at about 850° C. to first drive off the binder from the paste and then to sinter the glass and the gold. The fired glass-gold conductor has only about 60% of the electrical conductivity of bulk gold.

The conductor technology using thick film pastes also suffer from lot to lot variations of the pastes themselves. The cost associated with this thick film technology has inhibited its use where viable alternatives are available. However, the requirement for increasing the density of IC devices has forced its increased use despite all of the disadvantages enumerated herein.

An alternative process involves thin film technology where conductors are vacuum evaporated or sputtered onto 99% alumina substrates. These techniques are very expensive because of the very slow deposition rates of the conductors and because of the very high price of the 99% alumina substrate material.

To overcome the requirement for expensive gold conductors, there have been ongoing attempts to replace the gold paste with copper foil. One advantage to this substitution would be the ability to form more precise circuitry using dry film photoresist and conventional printed circuit board etching techniques. Dry film photoresist and conventional printed circuit etching are excellent techniques to produce accurate, reproducible and comparatively fine line circuitry on a copper layer bonded to a ceramic substrate. For example, 3 mil line widths on 3 mil spacings are relatively easy to generate using the above mentioned techniques. By contrast, the results from silk screened gold pastes is typically a 10 mil line width and somewhat more than 10 mil spacing. Also, cost comparisions are enormously favorable with forming circuitry in a copper layer.

Up until now, attempts to bond copper foil to alumina with glass under reducing conditions have invariably resulted in extensive blistering of the foil. This is due in part to the common use of CDA 11000 foil which contains cuprous oxide as a separate phase. When fired in a reducing atmosphere, the cuprous oxide in the alloy CDA 11000 is reduced and steam blistering results. It is also thought that blistering partially results from air entrapment in the glass due to the lack of a significant avenue of escape during the firing cycle. Blistering is particularly detrimental for multi-layer and hybrid circuitry because it creates a weak bond between the ceramic substrate and the copper foil which can lead to delamination. Also, during the etching process, the etching solutions can seep into a blister, at the glass to foil interface, and etch the foil at an undesirable location.

In an attempt to eliminate the problem of blistering, bonding under oxidizing conditions has been attempted as disclosed in a paper entitled "The Direct Bonding of Metals to Ceramics by the Gas-Metal Eutectic Method" by Burgess et al., published in *J. Electrochemical Society: SOLID-STATE SCIENCE AND TECHNOLOGY*, May, 1975. This technique has attempted to take advantage of the high temperature cuprous oxide formed on the foil. Although this approach produced good bonds without blistering, it formed a high temperature cuprous oxide film on the outer surface of the foil; this film is extremely difficult to remove.

The present invention also relates to multi-layer circuitry of which pin grid arrays or side brazed packages are typical examples. Pin grid arrays are typically small, multi-layer 96% alumina boards with conductive circuitry between the layers. The pin grid array minimizes the size required for large integrated circuits and permits the use of higher pin counts than possible with conventional quad packs. Side brazed packages are similar in construction to pin grid arrays except that electrical contact to the electrical circuitry is with pins brazed onto the side of the package. Both of these package designs provide rugged, reliable, hermetic packages and are preferable to CERDIPs because they are not dependent on glass encapsulation of the leads.

Conventional pin grid arrays typically contain at least three layers of alumina made by the tape cast process. The interlayer circuitry is fabricated with tungsten or moly-manganese powder silk screened onto a green alumina tape (96% $Al_2O_3$). The interconnects between the interlayer circuitry are provided through approximately about 5-10 mil holes punched in the green alumina tape. The interconnect or through-hole conductors are also formed with tungsten or moly-manganese powder. The multi-layer alumina tapes and conductor paths are cofired in the region of about 1550°-1600° C. This expels the polymeric binder from the alumina tape, sinters the 96% $Al_2O_3$ and produces partial sintering of the current carriers. The exposed conductors may then be coated with nickel by an electroless process. Thereafter, gold plated lead pins are brazed to the through-hole conductors.

There are a number of costly, technical problems in manufacturing pin grid arrays using the foregoing technology. The most serious technical problem is the very large volume contraction of the alumina tape when it is fired at high temperatures. The volume contraction can be as much as 60% and results in a lineal contraction of almost 20%. This causes severe problems in the location of the through-holes relative to the pins and also in maintaining through-hole electrical contact. In some cases, the contraction is so high that the conductive transverse circuitry misses the pin altogether. The conventional means of silk screening the interlayer circuitry on the alumina tape results in circuitry which is relatively dense and well sintered. However, the through-hole contact, which may be inserted mechanically, can be very loose and provide only low frequency particle to particle contact.

In the past, glass-ceramic structures with circuit patterns embedded therein were disclosed in U.S. Pat. No. 4,385,202 to Spinelli et al.; U.S. Pat. No. 4,301,324 to Kumar et al.; U.S. Pat. No. 4,313,026 to Yamada et al.; British Pat. No. 1,232,621 and British Pat. No. 1,349,671. Each of these patents specifically differs from the present invention in that it fails to teach or suggest the bonding of a deoxidized or oxygen free copper or copper alloy foil to a relatively pore-free, high temperature glass.

Multi-layered alumina circuit boards, whose layers are formed with the process of the present invention, are particularly useful as pin-grid arrays of the general type disclosed in the article entitled "Packaging" by Jerry Lyman, *Electronics*, Vol. 54, No. 26, Dec. 29, 1981.

It is a problem underlying the present invention to form a glass to metal laminate suitable for hybrid or multi-layer circuit board assemblies capable of high temperature stability wherein one or more layers of copper alloy foil are bonded to one or more layers of glass without forming blisters or bubbles at the interface between the foil layer or layers and the bonding glass.

It is an advantage of the present invention to provide a process of forming and the article of glass to metal laminates which obviate one or more of the limitations and disadvantages of the described prior processes and arrangements.

It is a further advantage of the present invention to provide a process of forming and the article of glass to metal laminates with deoxidized or oxygen free copper alloy foil bonded to a relatively pore-free bonding glass.

Accordingly, there has been provided a process of forming and the resulting glass to metal laminate. The steps include providing a glass and a metal foil of either deoxidized copper alloy or oxygen-free copper alloy. The glass is heated to a temperature of between about 600° to about 1025° C. with a viscosity between about $10^3$ to about $10^8$ poise. Then it is pressed against the foil and cooled to chemically bond it to the foil and form a laminate of a metal foil and a substantially pore-free glass.

BRIEF DESCRIPTION OF THE DRAWINGS

The invention and further developments of the invention are now elucidated by means of the preferred embodiments of the drawings.

Figure 1:
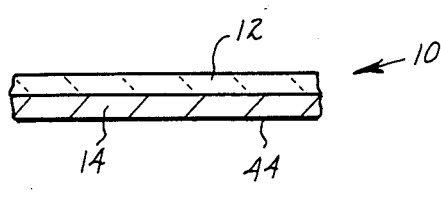
FIG. 1 illustrates a copper alloy foil bonded to a layer of essentially pore-free glass.
Figure 2:
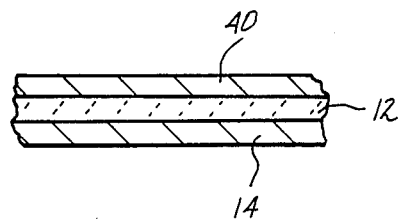
FIG. 2 illustrates a side cross-sectional view of two layers of copper alloy foil bonded to a layer of essentially pore-free glass layer disposed therebetween.

The present invention is directed to a metal-glass laminate 10. A glass 12 is provided along with a first metal foil 14 selected from the group consisting of deoxidized copper alloy and oxygen free copper alloy. The glass is heated, pressed against the foil and cooled whereby it is chemically bonded to the first metal foil to form a laminate of a layer of metal foil and a layer of relatively pore-free glass.

The glass 12 may be selected from any composition having a viscosity of about $10^3$ to about $10^8$ poise in the temperature range of about 600° C. to about 1025° C. The glass must be able to be chemically bonded to deoxidized copper alloy and oxygen free copper alloy. Preferably, the glass is selected from the group consisting of silicate, borosilicate, borate and phosphate glasses. The silicates preferably have a general composition of $BaO$-$ZnO$-$SiO_2$. The borosilicates preferably have a general composition of $B_2O_3$-$SiO_2$-MO where MO equals $Al_2O_3$, $MgO$, $CaO$, $BaO$, $K_2O$, $Na_2O$, $ZnO$, $SrO$, $ZrO_2$ and mixtures thereof.

The glass has a coefficient of thermal expansion (CTE) of between about $50 \times 10^{-7}$ to about $160 \times 10^{-7}$ in/in/° C. The CTE is selected to match the CTE of the dominant component of the system. For example, if the substrate is a ceramic, the CTE might be about $50 \times 10^{-7}$ to about $105 \times 10^{-7}$ in/in/° C. On the other hand, if the copper strip is the main component, the CTE might be about $140 \times 10^{-7}$ to about $160 \times 10^{-7}$ in/in/° C.

The object of the present invention is to form a glass-metal laminate where the glass is substantially pore-free. This structure is particularly useful for applications in the electronic industry where the copper alloy is subjected to a strong etching solution to dissolve portions of the copper layer and form circuit patterns. The pore-free glass has been found to be extremely resistive to attack and dissolution by the etching solution. Therefore, the circuitry formed in foil bonded to substantially pore-free glass is more precise and can be subjected to greater tolerance restrictions.

The glass layer is preferably bonded to the layer of foil in one of two ways. First, the glass having a viscosity of about $10^3$ to about $10^8$ poise and preferably between about $10^4$ to about $10^6$ poise may be coated directly onto the foil by any number of techniques as more fully elaborated on herein. Also, the glass may be formed into a solid glass preform. Then the glass can be disposed against the one layer of foil or alternatively between two or more layers of foil. The stacked layers are then heated to a temperature of about 600° to about 1025° C. where the glass has a viscosity of about $10^3$ to about $10^8$ and preferably between about $10^4$ to about $10^6$ at a temperature between about 800° to about 1000° C. The glass and foil are then pressed together at a pressure of less than about 350 gr/sq. in. and preferably between about 100 to about 200 gr/sq. in. The resulting glass-metal laminate is cooled in any conventional manner so that the glass chemically bonds to the foil. The resulting laminate can be cut to any desired size.

The glass composition is preferably selected to be free of lead oxide since lead oxide will partially reduce when heated in a reducing atmosphere. Lead in the glass may develop short circuits between adjacent layers of foil after etching. It is also desirable that the glass be essentially free of bismuth oxide since the latter may also partially reduce and develop short circuits in a manner similar to lead as described above.

There are two important considerations in the bonding process to prevent blistering of the foil. Firstly, the foil is preferably selected from an oxygen free or a deoxidized copper or copper alloy. Secondly, the bonding preferably occurs under reducing or inert conditions. For example, the copper foil is bonded to the glass in an atmosphere of inert or reducing gas such as for example, nitrogen, nitrogen 4% hydrogen or argon. The use of deoxidized or oxygen free copper foil prevents blistering within the foil when it is bonded under the reducing conditions.

The strip of metal foil 14 is preferably a copper alloy having an electrical conductivity of more than about 60% IACS. This high conductivity copper ally preferably has alloy additions which make up less than about 10% of the alloy and the remainder being copper. Examples of copper alloys which are thought to be suitable for practicing this invention include CDA 15100, CDA 12200, CDA 10200, and CDA 19400. The selected copper alloy material is preferably a foil, such as one ounce foil, which has been deoxidized. Using a deoxidized copper alloy foil is particularly important to prevent blistering within the foil or at the interface with the glass 12 as will be further described herein.

It is also within the terms of the present invention to select the copper alloy material 14 from an oxygen free copper which is typically an electrolytic copper substantially free from cuprous oxide and produced without the use of residual metallic or metalloidal deoxidizers. Generally, the composition of oxygen free copper is at least 99.95% copper with silver being considered as copper. Examples of oxygen free copper include CDA 10100, CDA 10200, CDA 10400, CDA 10500 and CDA 10700.

Figure 3:
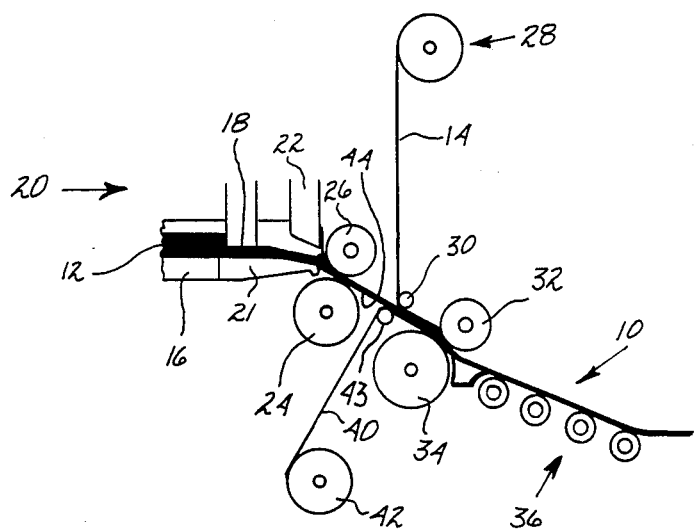
FIG. 3 illustrates a process for forming a layer of essentially pore-free glass between two layers of copper foil in accordance with the present invention.

The glass may be bonded to a strip of copper foil using a modified Pilkington process as illustrated in FIG. 3. This and other processes which are suitable to form the copper glass laminates are as described in the article entitled "Glass: Science and Technology", edited by D. R. Uhlmann and published in *Academic Press, Inc.*, 1984.

Referring to FIG. 3, the glass 12 is within a container 16 at a viscosity of about $10^3$ to about $10^8$ poise at a temperature range of about 600° to about 1025°. Preferably the glass has a viscosity between about $10^4$ to about $10^6$ poise at a temperature range of about 800° to about 1000° C. The glass flows under a flow controller 18 which can be moved up and down in a controlled manner to regulate the supply of glass in the pool upstream of rollers 34 and 26 in the forehearth 21. The glass flows across the forehearth in the direction of arrow 20 under a heat shield 22 which reduces the transmission of heat from the hearth to the cooling rolls 24. Next, rolls 24 and 26 rotate, contact the molten glass and pull the molten glass into the pass, from which it emerges as a ribbon of thickness determined by the separation between the rolls. These rolls are preferably water cooled and extract enough heat so that the viscosity of the ribbon emerging from the rolls is high enough to avoid narrowing from surface tension forces at the edges. This viscosity is preferably about $10^3$ to about $10^8$ poise and more preferably between about $10^4$ to about $10^6$ poise at a temperature between about 800° to about 1000° C. A layer of foil 14 is continuously fed from a roll 28, across a nip roller 30, until it contacts the moving glass strip. Another strip of foil 40 may be fed from a roll 42 across a nip roller 43, to contact the moving strip of glass. Then, the strip of glass and the strips of foil are passed between rollers 32 and 34 where they are subjected to a bonding pressure of about 50 to about 350 grams per square inch and preferably about 100 to about 200 grams per square inch to maintain contact between the glass and the foil. The reaction between the glass and foil results in a chemically bond resulting in a laminate 10.

Although FIG. 3 is illustrated with two sheets of foil being placed on either side of the glass strip, it is also within the terms of the present invention to only bond a single strip of foil against one surface of the glass. Further, it is within the terms of the present invention to only form a sheet of glass using a process of the type illustrated in FIG. 3 without the foil laminated thereto. The result is a preform of glass which can be bonded to a strip of copper foil as described herein.

The process of bonding a preform of glass to a copper foil as shown in FIG. 3 preferably occurs in an atmosphere of inert or reducing gas such as for example, nitrogen, nitrogen 4% hydrogen or argon. The use of deoxidized or oxygen-free copper foil prevents blistering in the foil or at the glass to foil interface when it is bonded under the reducing or inert conditions.

The conductive circuitry may be formed in the foil by a conventional photo-etching step. For example, the outer surface 44 of the glass foil laminate 10 is first coated with a positive photo-resist which may consist of a light sensitive resin of the photodegradable type. Then, a prescribed patterned mask of material, opaque to exposing light, is placed in contact with the photo-resist. On light exposure, only the unmasked portion of the photo-resist layer gets exposed. The mask is then removed and the resist is developed. The exposed portions of the resist are removed and the circuitry etched into the copper in a subsequent etching process. The etching may be accomplished with any conventional solution such as a $FeCl_3/HCl$ copper etchant. The assembly may be coated with photo-resist and etched in this manner several times to produce the desired patterns.

Figure 4:
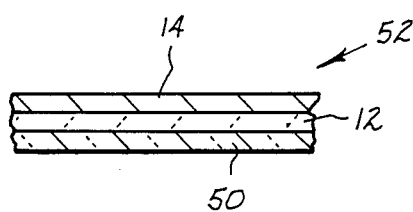
FIG. 4 illustrates a side cross-sectional view of a layer of copper foil glass bonded to a ceramic substrate.

The metal-glass laminates 10 may be bonded to a ceramic substrate 50 to form a composite structure 52 as shown in FIG. 4. The substrate 50 may be formed from an unfired ceramic sheet (green sheet) which may be constituted of materials including silica, silicon carbide, zirconia, zircon, berylia and alumina having a purity of about 90 to about 99%. Preferably, the ceramic material is a commercial 96% alumina which typically includes about 94.5% $Al_2O_3$ and the remainder including silica, manganese, calcium, and magnesium. It is also within the terms of the present invention to use combinations of the ceramic materials mentioned above or other ceramic materials as desired.

The process of bonding the substrate 50 to the laminate 52 includes stacking the glass foil laminate against the substrate so that the glass is in contact with the ceramic. Then the assembly is heated to a temperature of about 600° to about 1025° C. so that the glass has a viscosity of about $10^3$ to about about $10^8$ poise and preferably between about $10^4$ to about $10^6$ poise. The assembly is then pressed together at a pressure of about 50 to about 350 gr/sq. in. and preferably at about 100 to about 200 gr/sq. in. Finally the assembly is cooled so that the glass stiffens and is chemically bonded to the metal foil and the substrate.

The ceramic substrate may also be bonded to the copper foil with a thin, substantially pore-free glass preform. The preform may be disposed between the foil and the substrate. Then the assembly is heated to a temperature so that the glass has the desired viscosity as described above. Finally the assembly is put under pressure and cooled so that the glass is chemically bonded to the foil and to the substrate.

More details of this process are described in U.S. patent application Ser. No. 811,905, entitled "Multi-Layer and Hybrid Circuitry".

Figure 5:
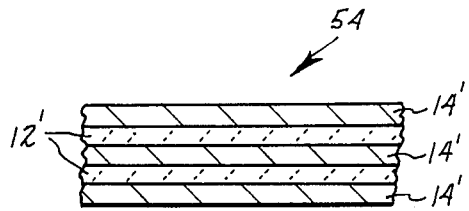
FIG. 5 illustrates a side cross-sectional view of a multi-layer structure in accordance with the present invention.

It is also within the terms of the present invention to stack three or more layers of foil with glass interposed between each layer as illustrated in FIG. 5. Components indicated by primed reference numerals are essentially the same as components with unprimed reference numerals. Each layer of foil 14' may be bonded to an adjacent layer of foil by glass 12' using the techniques described herein.

The multi-layer structure 54 illustrated in FIG. 5 may include through-hole connections and a ceramic substrate if desired as more fully described in U.S. patent application Ser. No. 811,905, entitled "Multi-Layer and Hybrid Circuitry".

The patents, patent applications and publications set forth in this application are intended to be incorporated by reference herein.

It is apparent that there has been provided in accordance with the present invention a metal-glass laminate which fully satisfies the objects, means and advantages set forth hereinabove. While the invention has been described in combination with the embodiments thereof, it is evident that many alternative, modifications and variations will be apparent to those skilled in the art in light of the foregoing description. Accordingly, it is intended to embrace all such alternatives, modifications and variations as fall within the spirit and broad scope of the appended claims.

We claim:

1. The process of forming a metal-glass laminate, comprising the steps of:
   providing a glass having a viscosity of between about $10^3$ to about $10^8$ poise at a temperature from about 600° to about 1025° C.;
   providing a first strip of metal foil from a material selected from the group consisting of deoxidized copper alloy and oxygen free copper alloy;
   heating said glass to form a strip of glass with a viscosity from about $10^3$ to about $10^8$ poise;
   providing a processing atmosphere consisting essentially of an inert or reducing gas;
   pressing said strip of heated glass against said first strip of metal foil within said processing atmosphere at a pressure of less than about 350 gr/sq. in. whereby blistering is substantially prevented within the foil;
   chemically bonding said strip of glass to said first strip of metal foil to form a laminate of said first strip of metal foil and a layer of substantially pore-free glass.

2. The process of claim 1 including the step of selecting said inert or reducing gas from the group consisting of nitrogen, nitrogen-4% hydrogen and argon.

3. The process of claim 2 wherein said glass has a consistency of about $10^4$ to about $10^6$ poise in a temperature range of about 800° to about 1000° C.

4. The process of claim 3 further including the step of selecting said glass from the group consisting of silicate, borosilicate, borate and phosphate glasses.

5. The process of claim 4 further including the step of selecting a silicate glass having a general composition of $BaO$-$ZnO$-$SiO_2$.

6. The process of claim 4 further including the step of selecting a borosilicate glass having a general composition of $B_2O_3$-$SiO_2$-$MO$ where MO equals $Al_2O_3$, $MgO$, $CaO$, $BaO$, $K_2O$, $Na_2O$, $ZnO$, $SrO$, $ZrO_2$ and mixtures thereof.

7. The process of claim 4 including the step of selecting said glass having a coefficient of thermal expansion between about $50 \times 10^{-7}$ to about $160 \times 10^{-7}$ in/in/° C.

8. The process of claim 7 including the step of etching an electrical circuit in said first strip of metal foil.

9. The process of claim 4 further including the steps of:
   providing a second strip of metal foil selected from the group consisting of deoxidized copper alloy and oxygen free copper alloy; and
   chemically bonding said second strip of metal foil to said layer of substantially pore-free glass in said processing atmosphere so as to substantially prevent blistering within said second strip of foil whereby said glass layer forms an insulator between said first and second strips of metal foil.

10. The process of claim 9 including the step of etching an electrical circuit in said first strip of metal foil.

11. The process of claim 10 including the step of etching an electrical circuit in said second strip of metal foil.

12. The process of claim 1 further including the steps of:
   providing a ceramic substrate;
   disposing said metal-glass laminate on said ceramic substrate with said glass contacting said ceramic substrate;
   heating said metal-glass laminate and said ceramic substrate to a temperature of about 600° to about 1025° C. where the glass has a viscosity from about $10^3$ and about $10^8$ poise; and
   bonding said layer of substantially pore-free glass to said ceramic substrate.

13. The article produced by the process of claim 1.

14. The article produced by the process of claim 2.

15. The article produced by the process of claim 9.

16. A metal-glass laminate, comprising:
   a first strip of metal foil selected from the group consisting of deoxidized copper alloy and oxygen-free copper alloy; and
   a layer of substantially pore-free glass, said layer of substantially pore-free glass being chemically bonded to said first strip of metal foil whereby said first strip of metal foil is substantially free of blisters.

17. The metal-glass laminate of claim 16 wherein said glass is selected from the group consisting of silicate, borosilicate, borate and phosphate glasses.

18. The metal-glass laminate of claim 17 further including a second strip of metal foil selected from the group consisting of deoxidized copper alloy and oxygen-free copper alloy, said second strip of foil being chemically bonded to said layer of substantially pore-free glass whereby said second strip of metal foil is substantially free of blisters and so that said first and second strips of foil are electrically insulated from each other.

* * * * *